United States Patent
Singh et al.

(10) Patent No.: US 9,691,654 B1
(45) Date of Patent: Jun. 27, 2017

(54) METHODS AND DEVICES FOR BACK END OF LINE VIA FORMATION (71) Applicant: GLOBALFOUNDRIES Inc., Grand Cayman (KY)

(72) Inventors: Sunil Kumar Singh, Mechanicville, NY (US); Sohan Singh Mehta, Saratoga Springs, NY (US); Ravi Prakash Srivastava, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/978,650

(22) Filed: Dec. 22, 2015

(51) Int. Cl.
*H01L 23/48* (2006.01)
*H01L 21/768* (2006.01)
*H01L 23/522* (2006.01)
*H01L 23/528* (2006.01)

(52) U.S. Cl.
CPC .. *H01L 21/76817* (2013.01); *H01L 21/76814* (2013.01); *H01L 21/76879* (2013.01); *H01L 23/528* (2013.01); *H01L 23/5226* (2013.01)

(58) Field of Classification Search
CPC ......... H01L 21/76814; H01L 21/76879; H01L 23/5226; H01L 23/528
USPC ....................................................... 257/744
See application file for complete search history.

(56) References Cited

U.S. PATENT DOCUMENTS

| | | | | |
|---|---|---|---|---|
| 5,972,862 A * | 10/1999 | Torii | ....................... | G03F 7/423 134/1.2 |
| 2002/0072016 A1* | 6/2002 | Chen | ....................... | G03F 7/427 430/323 |
| 2002/0098676 A1* | 7/2002 | Ning | ...................... | B82Y 10/00 438/622 |
| 2008/0093743 A1* | 4/2008 | Yang | ................... | B81C 1/00095 257/758 |
| 2009/0236309 A1* | 9/2009 | Millward | ............ | B81C 1/00031 216/39 |
| 2012/0329273 A1* | 12/2012 | Bruce | ............... | H01L 21/02203 438/653 |
| 2013/0005147 A1* | 1/2013 | Angyal | ............. | H01L 21/31116 438/692 |

* cited by examiner

*Primary Examiner* — Benjamin Sandvik
*Assistant Examiner* — Herve Assouman
(74) *Attorney, Agent, or Firm* — Heslin Rothenberg Farley & Mesiti P.C.; Jacquelyn A. Graff (57) ABSTRACT

Back end of line via formation for semiconductor devices and methods of fabricating the semiconductor devices. One method includes, for instance: obtaining a wafer with a substrate and at least one contact in the substrate; depositing at least one lithography stack over the substrate; performing lithography to pattern at least one via opening; depositing a block co-polymer coating over the wafer into the at least one via opening; performing an ashing to remove excess block co-polymer material and form block co-polymer caps; and performing a thermal bake to separate the block co-polymer caps into a first material and a second material. An intermediate semiconductor device is also disclosed.

11 Claims, 8 Drawing Sheets

METHODS AND DEVICES FOR BACK END OF LINE VIA FORMATION

FIELD OF THE INVENTION

The present invention relates to semiconductor devices and methods of fabricating semiconductor devices, and more particularly, to methods and devices for back end of line via formation.

BACKGROUND OF THE INVENTION

As semiconductor devices continue to decrease in size, the size of trenches and vias continue to decrease. With smaller trenches and vias the semiconductor devices may experience via bowing and time dependent dielectric breakdown resulting in, for example, via to metal shorts and lower resolution and uniformity. The shorts and dielectric breakdown may decrease the device yield and reliability and also increase defectivity. Thus, new devices and methods for shrinking the critical dimension of back end of line via formation is needed.

SUMMARY OF THE INVENTION

The shortcomings of the prior art are overcome and additional advantages are provided through the provision, in one aspect, a method includes obtaining a wafer with a substrate and at least one contact in the substrate; depositing at least one lithography stack over the substrate; performing lithography to pattern at least one via opening; depositing a block co-polymer coating over the wafer into the at least one via opening; performing an ashing to remove excess block co-polymer material and form block co-polymer caps; and performing a thermal bake to separate the block co-polymer caps into a first material and a second material.

In another aspect, an intermediate semiconductor device is provided which includes, for instance: a substrate; at least one first contact in the substrate; at least one second contact in the substrate; and at least one block co-polymer cap aligned with the at least one second contact.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with improved yield, defectivity, and reliability.

Figure 1:
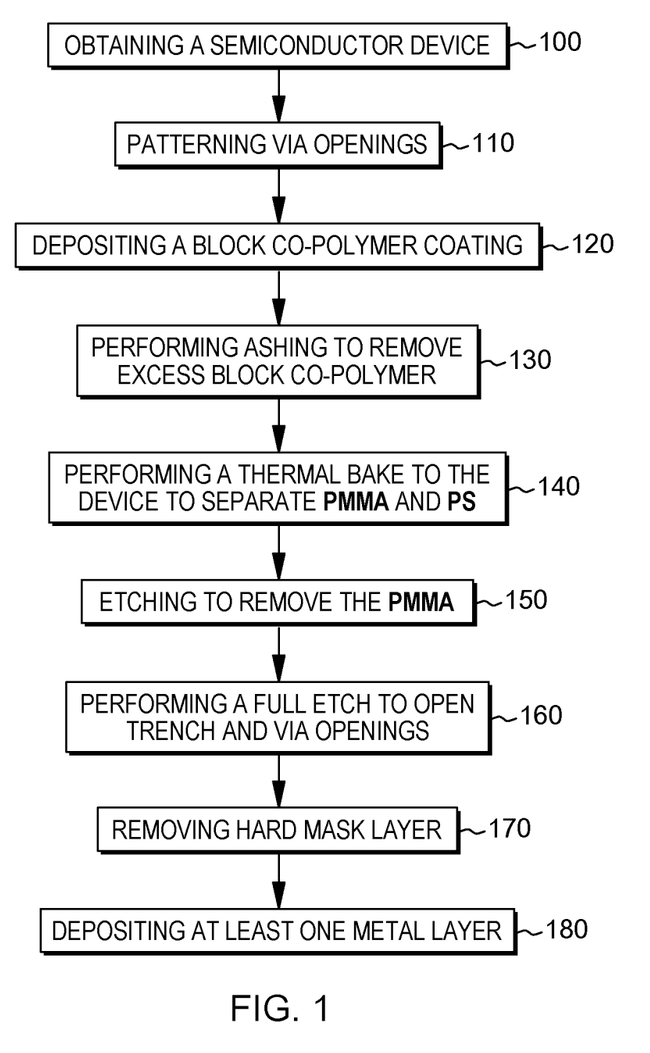
FIG. 1 depicts one embodiment of a method to shrink back end of line via critical dimension formation, in accordance with one or more aspects of the present invention.

In one aspect, in one embodiment, as shown in FIG. 1, the semiconductor device formation process in accordance with one or more aspects of the present invention may include, for instance: obtaining a semiconductor device 100; performing lithography to pattern at least one via opening 110; depositing a block co-polymer coating over the semiconductor device 120; performing an ashing to remove excess block co-polymer material 130; performing a thermal bake to the device to separate the PMMA and PS 140; etching to remove the PMMA 150; performing a full etch to open the at least one trench opening and the at least one via opening 160; removing a hard mask layer 170; and depositing at least one metal layer over the semiconductor device 180.

FIGS. 2-12 depict, by way of example only, a detailed embodiment of a portion of a semiconductor device formation process of FIG. 1 and an intermediate semiconductor device, in accordance with one or more aspects of the present invention. Note again that these figures are not drawn to scale in order to facilitate understanding of the invention, and that the same reference numerals used throughout different figures designate the same or similar elements.

Figure 2:
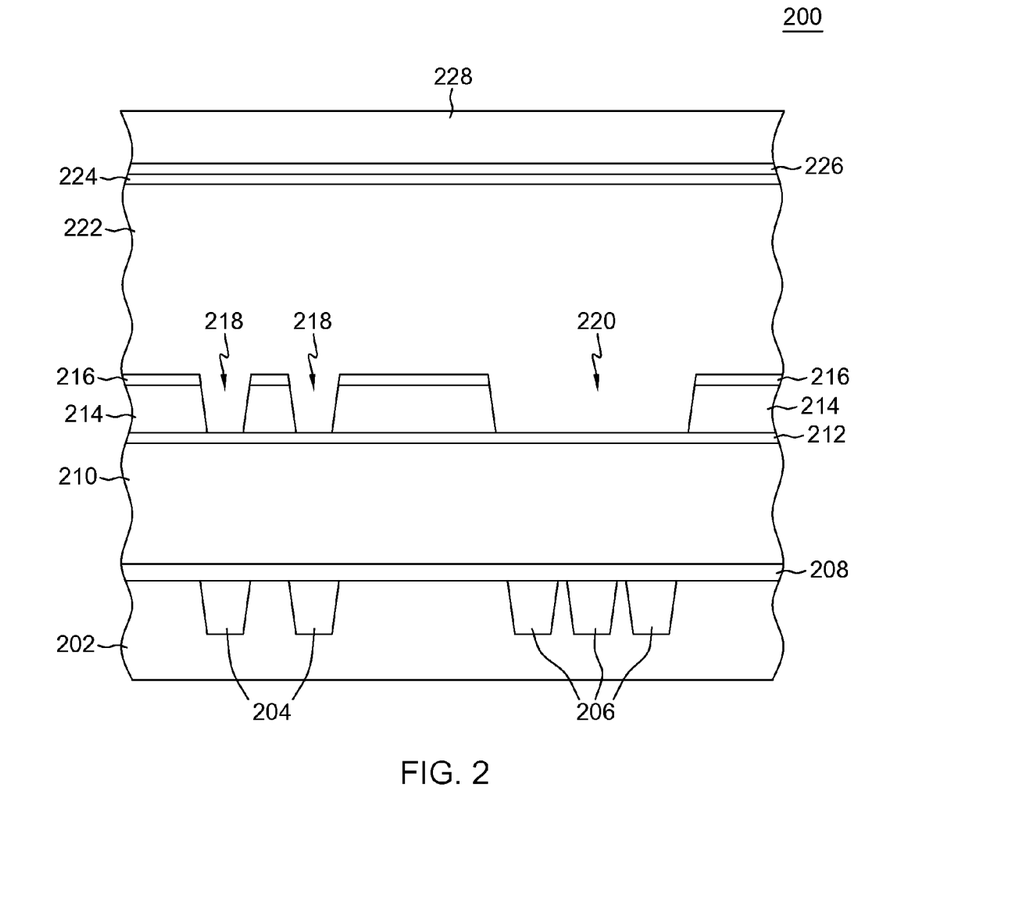
FIG. 2 depicts a cross-sectional elevation view of one embodiment of an integrated circuit with at least one lithography stack over the intermediate semiconductor device, in accordance with one or more aspects of the present invention.

One detailed embodiment of a portion of the semiconductor device formation process of FIG. 1 is depicted, by way of example only, in FIGS. 2-12. FIG. 2 shows a portion of a semiconductor device 200 obtained during the fabrication process. The device 200 may have been processed through initial device processing steps in accordance with the design of the device 200 being fabricated, for example, the device 200 may include, for example, a substrate 202 with at least one first contact 204 and at least one second contact 206. The device 200 may also include at least one isolation region (not shown), at least one fin (not shown), source regions (not shown), drain regions (not shown) and the like. The substrate 202 may in some embodiments have or be a substantially crystalline substrate material (i.e., bulk silicon), whereas in other embodiments, substrate 202 may be formed on the basis of a silicon-on-insulator (SOI) architecture. The at least one contact openings 204, 206 may be filled with a metal, for example, tungsten (W). The device 200 may also include an insulation layer 208 deposited over the substrate 202. The insulation layer 208 may be, for example, a nitrogen-doped silicon carbide, such as NBLoK. The device 200 may further include an interlayer dielectric (ILD) layer 210 deposited over the insulation layer 208. The ILD layer 210 may be, for example, carbon doped oxide dielectric, such as, SiCOH (C-doped Si—O k=2.0-2.7), and the like, or a combination of these commonly used dielectric materials.

Next, as also shown in FIG. 2, a first dielectric hard mask layer 212 may be deposited over the device 200. The first dielectric hard mask layer 212 may be, for example, a dielectric hard mask layer, such as, silicon oxynitride (SiON), tetraethyl orthosilicate (TEOS), or silicon dioxide (SiO$_2$). A hard mask layer 214 may then be deposited over the device 200 and the hard mask layer 214 may be, for example, a metal hard mask layer 214, such as, titanium nitride (TiN) and tantalum nitride (TaN). A second dielectric hard mask layer 216 may then be deposited over the metal hard mask layer 214. The second dielectric hard mask layer 216 may be, for example, a dielectric hard mask layer, such as, SiON, TEOS, or SiO$_2$. The first and second dielectric hard masks 212, 216 may act as protective layers for the underlying layers during the device fabrication, for example, during an ashing process of a photoresist mask layer. The first and second dielectric hard masks 212, 216 may have an etch selectivity relative to at least the material including the upper surface portion of the ILD layer 210, such as silicon nitride (SiN), silicon oxynitride (SiON), silicon carbide (SiC), silicon carbonitride (SiCN), and the like. The dielectric hard masks 212, 216 may be formed above the contacts 204, 206 by performing a suitable deposition process based on device parameters well known in the art, such as, a chemical vapor deposition (CVD) process, a physical vapor deposition (PVD) process, an atomic layer deposition (ALD), a spin on coating, and the like.

Then, lithography may be performed to pattern at least one first opening 218 and at least one second opening 220, as shown in FIG. 2. The lithography may be performed by known methods including applying a lithography stack (not shown) over the device 200, patterning the lithography stack (not shown) and then etching into the second dielectric layer 216 and the hard mask layer 214 to form the openings 218, 220. After the openings 218, 220 are formed, a second lithography stack may be applied over the device 200. The second lithography stack may include a spin-on-hardmask (SOH) layer 222, a third dielectric layer 224, a bottom anti-reflection coating (BARC) layer 226, and a photoresist layer 228. The SOH layer 222 may be deposited over the device 200 filling the openings 218, 220. The third dielectric layer 224 may be deposited over the SOH layer 222 and may be, for example, a SiON layer or a silicon-containing anti-reflective coating (Si-ARC) layer.

Figure 3:
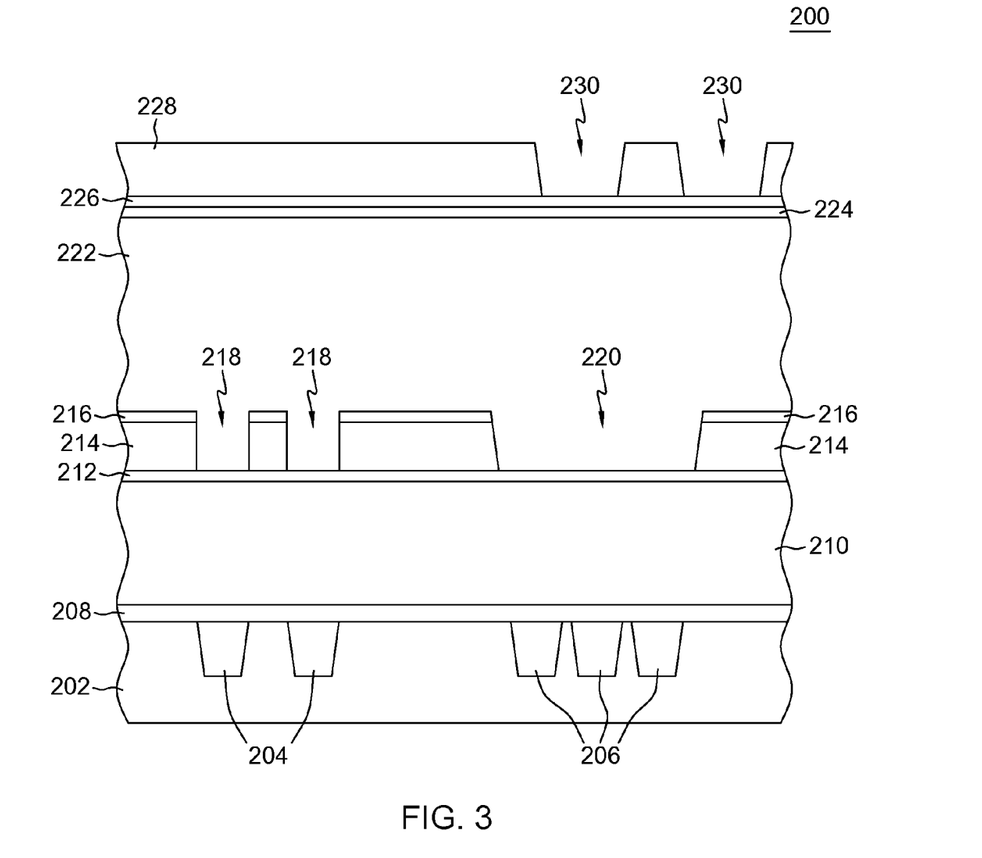
FIG. 3 depicts the cross-sectional elevation view of the semiconductor device of FIG. 2 after performing lithography to pattern at least one via, in accordance with one or more aspects of the present invention.
Figure 4:
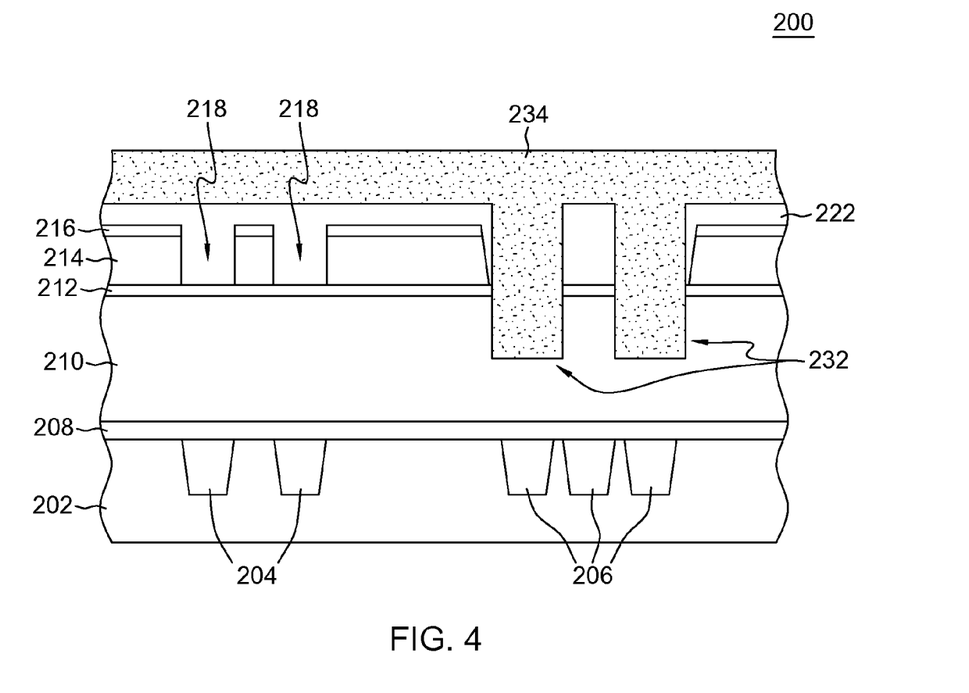
FIG. 4 depicts the cross-sectional elevation view of the semiconductor device of FIG. 3 after etching to pattern the at least one via and depositing a block co-polymer (BCP) over the intermediate semiconductor device, in accordance with one or more aspects of the present invention.

Next, as shown in FIGS. 3 and 4, lithography may be performed to pattern openings 230 in the photoresist layer 228. The device 200 may then be etched to form at least one via or via opening 232 through the BARC layer 226, the third dielectric layer 224, the SOH layer 222, the second dielectric layer 216, the hard mask layer 214, the first dielectric layer 212 and into the ILD layer 210. Once the at least one opening 232 is formed any remaining portion of the second lithography stack may be removed from the device 200. A portion of the SOH layer 222 may also be removed, as shown in FIG. 4. Next, as also shown in FIG. 4, a block co-polymer (BCP) layer 234 may be deposited over the device 200. The BCP layer 234 may be deposited by, for example, a spin-on process.

Figure 5:
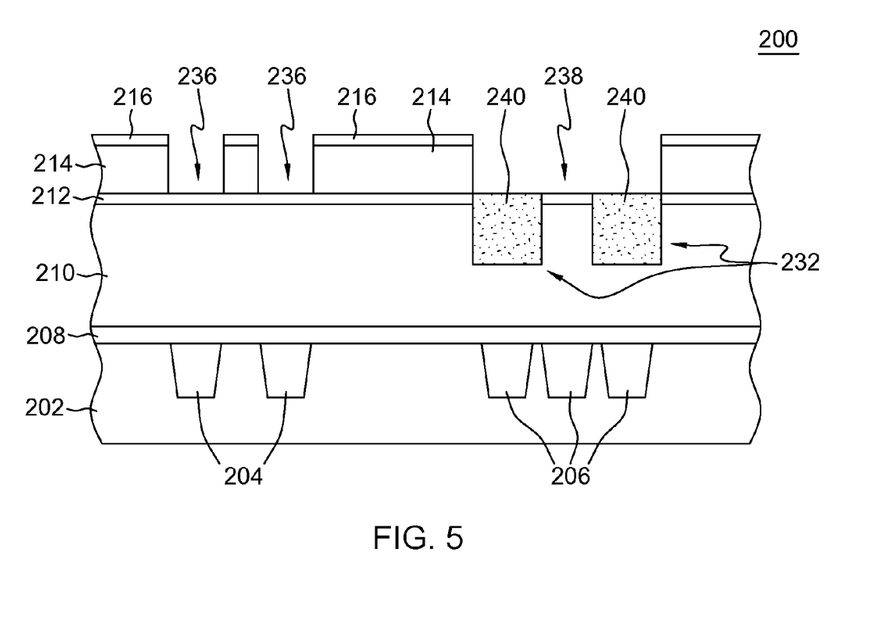
FIG. 5 depicts the cross-sectional elevation view of the semiconductor device of FIG. 4 after performing an ashing to remove the excess BCP material, in accordance with one or more aspects of the present invention.
Figure 6:
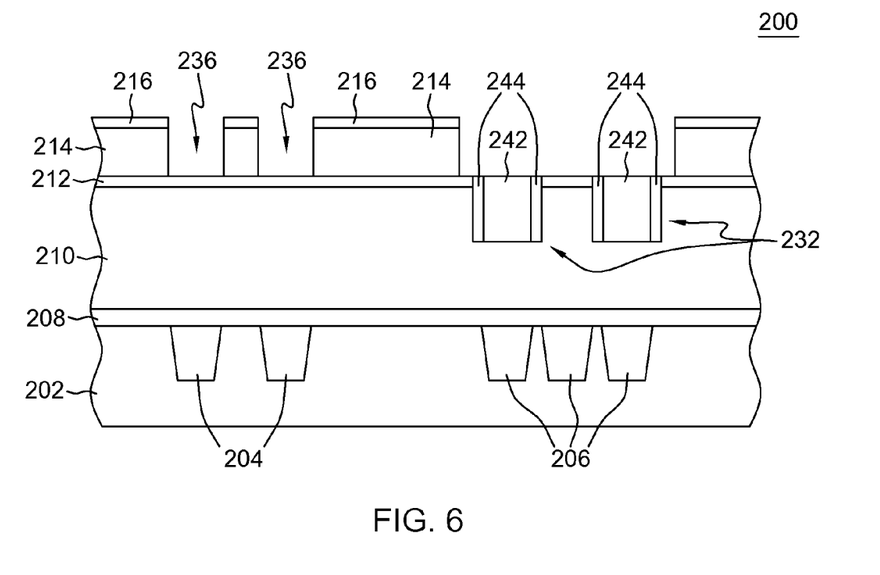
FIG. 6 depicts the cross-sectional elevation view of the semiconductor device of FIG. 5 after performing a thermal bake to the intermediate semiconductor device to separate the BCP material into polymethyl methacrylate (PMMA) and polystyrene (PS), in accordance with one or more aspects of the present invention.
Figure 7:
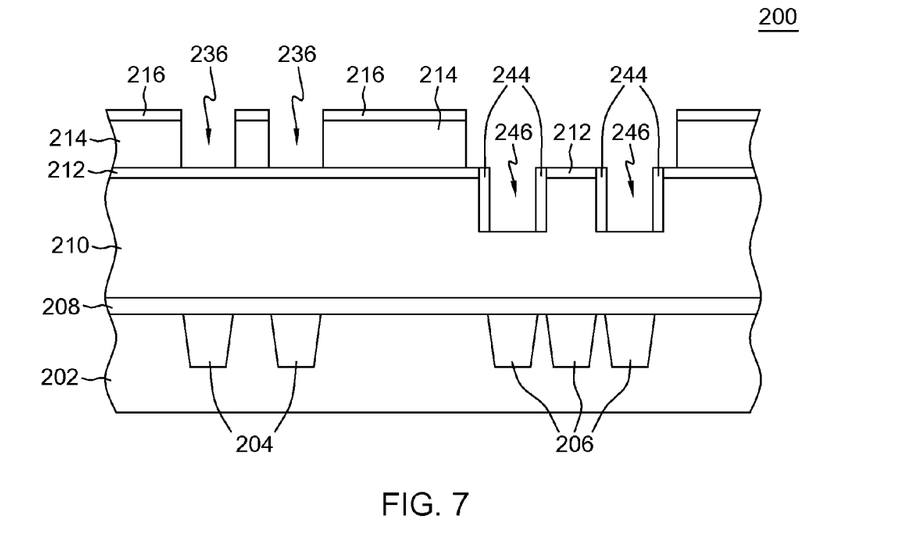
FIG. 7 depicts the cross-sectional elevation view of the semiconductor device of FIG. 6 after removing the PMMA from the intermediate semiconductor device, in accordance with one or more aspects of the present invention.

An ashing process may then be performed on the device 200 removing a portion of the BCP layer 234 and forming BCP caps 240 in the openings 232, as shown in FIG. 5. Next, the device 200 may be thermally baked. The thermal bake may allow for the BCP caps to separate into a first material 242 and a second material 244, as shown in FIG. 6. The second material 244 may line the side walls of the at least one opening 232 and the first material 242 may be positioned between the second material 244. The first material 242 may be, for example, polymethyl methacrylate (PMMA), and the second material 244 may be, for example, polystyrene (PS). Then, the PMMA 242 may be removed by, for example, wet etching or exposure and wet etching, to form at least one opening 246 between the PS material 244, as shown in FIG. 7.

Figure 8:
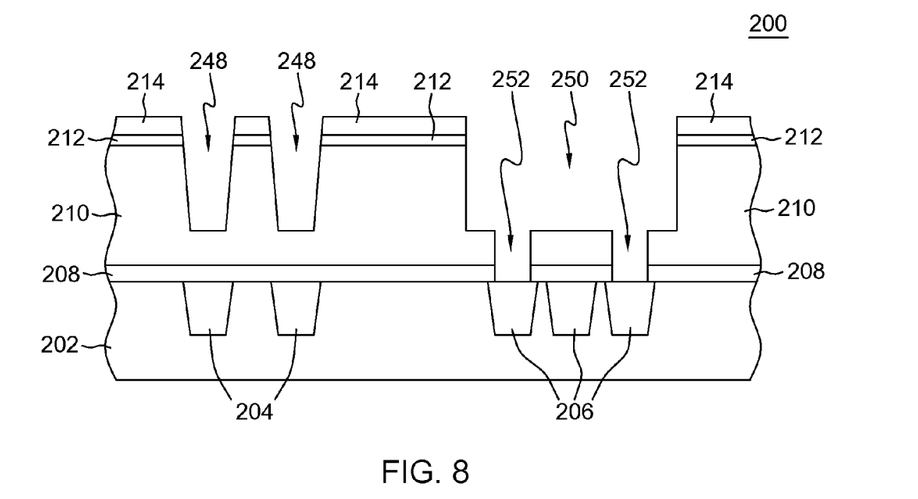
FIG. 8 depicts the cross-sectional elevation view of the semiconductor device of FIG. 7 after performing a full etch to open the at least one trench and at least one via, in accordance with one or more aspects of the present invention.
Figure 9:
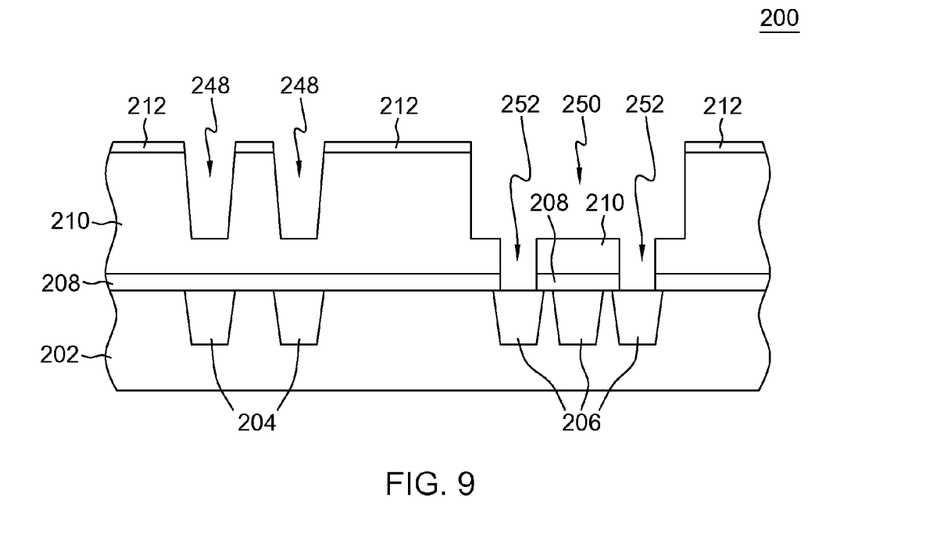
FIG. 9 depicts the cross-sectional elevation view of the semiconductor device of FIG. 8 after stripping the hard mask layer, in accordance with one or more aspects of the present invention.

As shown in FIG. 8, once the at least one opening 246 is formed, a full etch may be performed to form openings 248, 250, 252. The openings 248, 250 may be, for example, at least one trench or trench opening, and the at least one opening 252 may be, for example, at least one via or via opening. The at least one via opening 252 may be, for example, etched down to contact at least one contact opening 206. After the openings 248, 250, 252 are formed, the metal hard mask layer 214 may be stripped, as shown in FIG. 9. The metal hard mask layer 214 may be stripped by, for example, a wet clean, such as EKC to remove any of the remaining metal hard mask layer 214.

Figure 10:
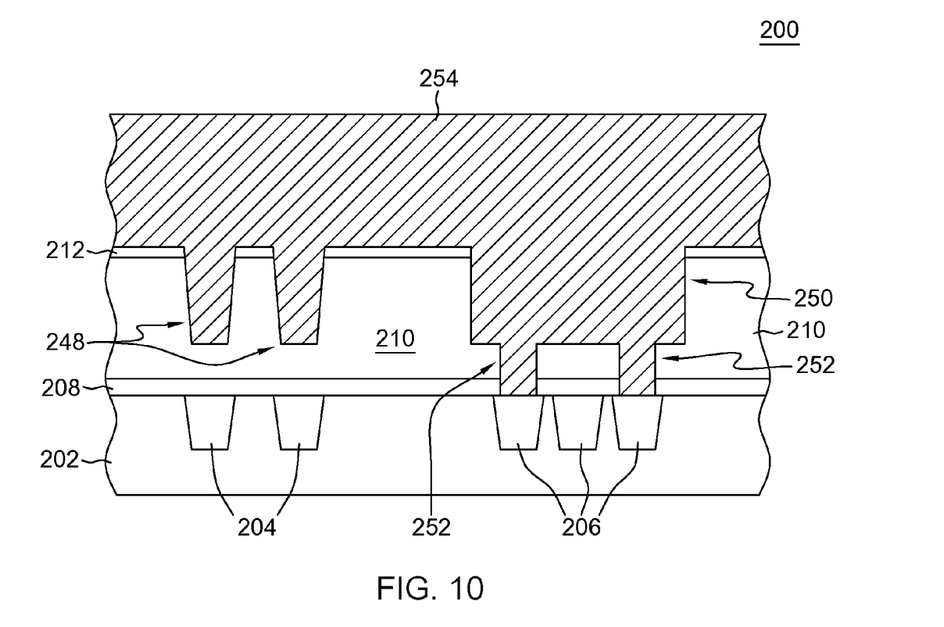
FIG. 10 depicts the cross-sectional elevation view of the semiconductor device of FIG. 9 after performing a barrier deposition, a seed deposition, and metal plating, in accordance with one or more aspects of the present invention.
Figure 11:
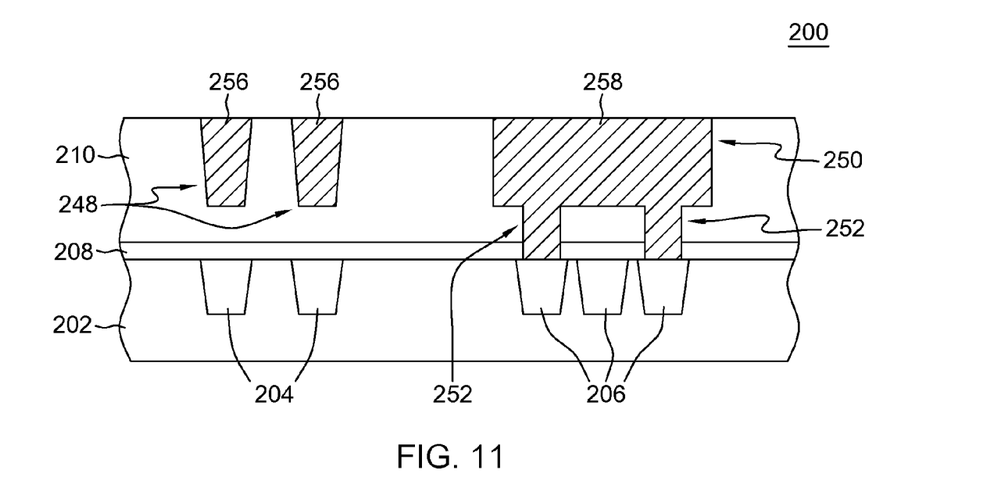
FIG. 11 depicts a first cross-sectional elevation view of the semiconductor device of FIG. 10 after performing a chemical mechanical planarization (CMP), in accordance with one or more aspects of the present invention.
Figure 12:
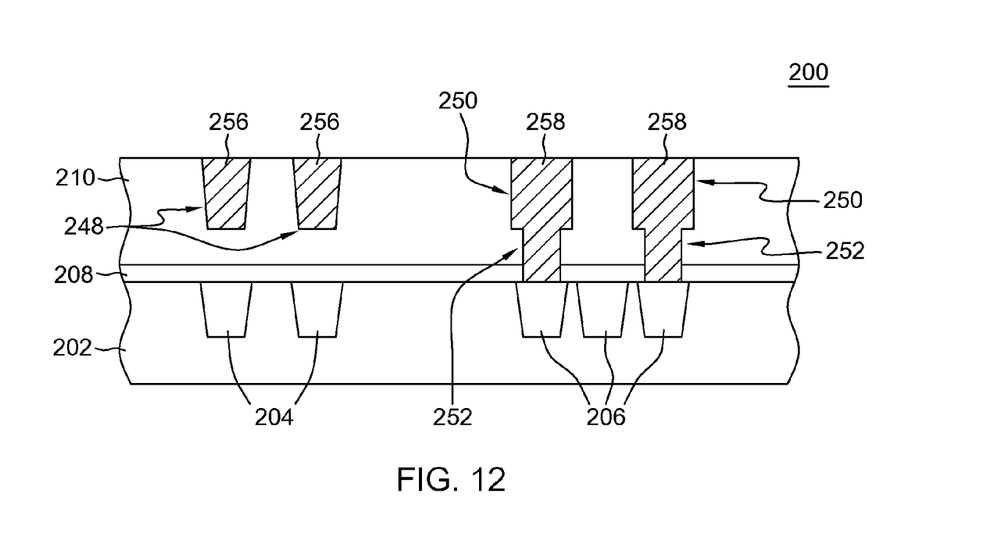
FIG. 12 depicts a second cross-sectional elevation view of the semiconductor device of FIG. 10 after performing a CMP, in accordance with one or more aspects of the present invention.

A metal deposition process may then be performed to deposit at least one metal layer 254 into the trench openings 248, 250 and via openings 252, as shown in FIG. 10. The metal deposition process may be any suitable metal deposition process known in the art. For example, the metal deposition process may include depositing a barrier layer (not shown) over the device 200 and into the trench openings 248, 250 and via openings 252. Next, the metal deposition process may include depositing a seed layer (not shown) over the barrier layer (not shown). Then, the trench openings 248, 250 and via openings 252 may be filled with a layer of conductive contact material 254 based on a substantially "bottom-up" deposition process well known to those skilled in the art, such as, a suitably designed electrochemical plating (ECP) process and the like, thereby reducing the likelihood of voids formed and/or trapped in the finished trenches and vias 256, 258. The finished trenches and vias 256, 258 are shown in FIGS. 11 and 12 after a CMP is performed. A cross-section of the device 200 in the non-self-aligned via direction is shown in FIG. 11 and a cross-section of the device 200 in the self-aligned via direction is shown in FIG. 12.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining a wafer with a substrate and at least one contact in the substrate;
   depositing a first lithography stack over the substrate;
   performing a first lithography to pattern at least one trench opening;
   depositing a second lithography stack over the wafer;
   performing a second lithography to pattern at least one via opening;
   depositing a block co-polymer coating over the wafer into the at least one via opening;
   performing an ashing to remove excess block co-polymer material and form block co-polymer caps;
   performing a thermal bake to separate the block co-polymer caps into a first material and a second material;
   etching to remove the first material and form at least one smaller opening; and
   performing a full etch to open the at least one trench opening and the at least one via opening, wherein the at least one via opening is formed through the at least one smaller opening.

2. The method of claim 1, wherein the at least one contact comprises:
   at least one first contact; and
   at least one second contact.

3. The method of claim 2, wherein the wafer further comprises:
   an insulation layer deposited over the substrate;
   an interlayer dielectric layer deposited over the insulation layer;
   a first dielectric layer deposited over the insulation layer;
   a hard mask layer deposited over the first dielectric layer; and
   a second dielectric layer deposited over the hard mask layer.

4. The method of claim 3, wherein the wafer further comprises:
   at least one first opening; and
   at least one second opening, wherein the at least one first opening and the at least one second opening extend from a top surface of the second dielectric layer, through the second dielectric layer and a metal hard mask layer, and down to the first dielectric layer.

5. The method of claim 4, wherein the second lithography stack is deposited over the second dielectric layer and the second lithography stack comprises:
   a spin-on-hardmask layer;
   a third dielectric layer over the spin-on-hardmask layer;
   a bottom anti-reflection coating layer over the third dielectric layer; and
   a photoresist layer.

6. The method of claim 5, wherein the at least one via opening extends through a portion of the spin-on-hardmask layer, the second dielectric layer, the hard mask layer, the first dielectric layer, and into a portion of the interlayer dielectric layer.

7. The method of claim 6, wherein the first material of the block co-polymer caps is a polymethyl methacrylate.

8. The method of claim 7, wherein the second material of the block co-polymer caps is polystyrene.

9. The method of claim 6, wherein the at least one via opening aligns with and contacts a top surface of the at least one second contact.

10. The method of claim 9, further comprising:
    removing the hard mask layer; and
    depositing at least one metal layer over the wafer and into the at least one trench opening and at least one via opening.

11. The method of claim 10, wherein removing the hard mask layer comprises:
    performing an EKC wet etch to strip the hard mask layer.

* * * * *